(12) United States Patent
Esashi et al.

(10) Patent No.: US 6,747,465 B2
(45) Date of Patent: Jun. 8, 2004

(54) CONTRACTOR, METHOD FOR MANUFACTURING THE SAME, AND PROBE CARD USING THE SAME

(75) Inventors: Masayoshi Esashi, 11-9, Yagiyamaminami 1-chome, Taihaku-ku, Sendai-shi, Miyagi-ken (JP); Shinji Iino, Nirasaki (JP); Tomohisa Hoshino, Nirasaki (JP)

(73) Assignees: Tokyo Electron Limited, Toyko (JP); Masayoshi Esashi, Sendai (JP)

(*) Notice: Subject to any disclaimer, the term of this patent is extended or adjusted under 35 U.S.C. 154(b) by 105 days.

(21) Appl. No.: 09/986,561

(22) Filed: Nov. 9, 2001

(65) Prior Publication Data

US 2002/0057099 A1 May 16, 2002

(30) Foreign Application Priority Data

Nov. 13, 2000 (JP) ........................................ 2000-345577

(51) Int. Cl.[7] ................................................ G01R 31/02
(52) U.S. Cl. ..................... 324/754; 324/758; 324/158.1; 324/765
(58) Field of Search ................................. 324/765, 754, 324/158.1, 758, 757, 761, 755, 72.5; 458/14, 17, 18, 161; 439/482, 66

(56) References Cited

U.S. PATENT DOCUMENTS

| | | | | |
|---|---|---|---|---|
| 5,825,192 A | * | 10/1998 | Hagihara | 324/757 |
| 5,949,245 A | * | 9/1999 | Liu | 324/762 |
| 6,072,190 A | * | 6/2000 | Watanabe et al. | 257/48 |
| 6,114,864 A | * | 9/2000 | Soejima et al. | 324/754 |
| 6,307,392 B1 | * | 10/2001 | Soejima et al. | 324/762 |

FOREIGN PATENT DOCUMENTS

JP 8-50146 2/1996

* cited by examiner

*Primary Examiner*—Evan Pert
*Assistant Examiner*—Jimmy Nguyen
(74) *Attorney, Agent, or Firm*—Oblon, Spivak, McClelland, Maier & Neustadt, P.C.

(57) ABSTRACT

There is disclosed a contactor which is used for testing electric characteristics of an object to be tested, the contactor comprising a contactor board, a plurality of conductive members formed through the contactor board, a plurality of beam members, and a contact terminal provided at the tip of each beam member. In this contactor, each beam member has a tip and a base end at its both ends, and has a step shape or an arch shape between the tip and the base end. The base end of each beam member is connected to each conductive member. The contact terminal member can be formed integrally with a conductive layer of the beam member.

18 Claims, 10 Drawing Sheets

CONTRACTOR, METHOD FOR MANUFACTURING THE SAME, AND PROBE CARD USING THE SAME

CROSS-REFERENCE TO RELATED APPLICATIONS

This application is based upon and claims the benefit of priority from the prior Japanese Patent Application No. 2000-345577, filed Nov. 13, 2000, the entire contents of which are incorporated herein by reference.

BACKGROUND OF THE INVENTION

1. Field of the Invention

The present invention relates to a contactor used to test an object to be tested for its electric characteristics, a method for manufacturing the contactor, and a probe card using the contactor.

2. Description of the Related Art

To test the electric characteristics of many subjects to be tested, for example, IC chips such as memory devices or logic devices formed on a semiconductor wafer (hereinafter called "wafer" simply), a probe card having a contactor can be used. In testing, by contacting the contact terminals (probe needles) of the contactor of the probe card to the corresponding electrode pads of the IC chip, the IC chip can be electrically connected to a tester. By this connection, a testing signal can be received and transmitted between the two. The contact terminals of the contactor of this probe card may be, for example, probe needles made of tungsten.

Recently, with the ever increasing integration density of an IC chip, its electrode pads have rapidly become numerous, shrunk in size, and narrowed in pitch. Since the probe needles made of tungsten employed in a probe card are made manually, its manufacturing costs increase and its delivery time limit is prolonged in proportion to the number of the pins used.

To meet a demand for reduction in the testing costs, there has been commercially available such a multi-chip contactor that enables simultaneous measurement of a plurality of IC chips. For example, there is a case where the number of contact terminals of the contactor for testing a logic device exceeds 2000. In the case of testing a memory device, there is a demand for increasing the number of devices to be measured simultaneously from 32 to 64. From this viewpoint, it is expected that the number of the contactor pins exceeds 5000 in the near future. As the pad size has decreased, it has been more and more difficult to manufacture the probe card.

The necessity of reserving a proper needle pressure for a probe card using tungsten-made needles limits the shortening of the needles. This is due to the Young's modulus, assembly, etc. Since the length of the needles has an influence on the high-frequency characteristics of a high-speed device, there may be a fear that expected test results cannot be obtained.

To manufacture the contactor properly, there have been developed various technologies such as photolithography, etching, sputtering, plating, and other film forming technologies. Such a contactor is comprised of a contact terminal of, for example, a pyramid shape, a beam member supporting the contact terminal at its tip, a post supporting the beam member at its base end, and a board connected through the post. This contactor eliminates problems of a tungsten-made needle. Such a contact has a cantilever type structure in which the probe itself is fixed to the post. The contact terminal, the beam member, and the post of the probe are formed by their respective processes and undergo mechanical connection between the contact terminal and the beam member, that between the beam member and the post, and that between the post and the board by use of a means of, for example, transferring a wax material.

By a prior art method of manufacturing a contactor, its contact terminals, beam members, and posts are formed by different processes and then connected and unified. As a result, failure is liable to occur at the connection, leading to a problem of a lowered yield. Furthermore, this prior art suffers from many limitations; for example, the melting points of various wax materials used at the connection at a plurality of positions must be changed properly.

For example, Jpn. Pat. Appln. KOKAI Publication No. 8-50146 discloses a contactor having a structure utilizing, as a buckling space, a groove formed in a lower part of the beam member (probe) having a contact terminal. Jpn. Pat. Appln. KOKAI Publication No. 11-133062 discloses a structure in which a post (supporting portion) is provided to reserve the buckling space of the beam member (lead portion) having the contact terminal. Such a probe card is disclosed that has a structure in which the beam member is connected on this post. In the former case, the contact terminal is comprised of a silicon core and a plurality of conductive films coating the core. Although the beam member can be formed at the same time as the conductive films of the contact terminal, the formation of the contact terminal and the beam member requires a plurality of processes. Since the beam member and the board are further interconnected through a different lead wire, the number of connections increases, thus resulting in an increased contact resistance at the connections. In the latter case, a process is required to form the post besides a process for forming the beam member and also the beam member is disposed on the board through the post, thus resulting in an increased contact resistance at the connection.

The present invention solves at least one of the above-mentioned problems. One feature of one aspect of the present invention enables simplifying the processes of forming the contact terminal and the beam member. Another feature of another aspect of the present invention enables obtaining a contactor with an improved reliability of the structure. A further feature of another aspect of the present invention enables providing a contactor which improves the high-frequency characteristics and enables conducting reliable testing, a probe card using the same, and a method for manufacturing the same. An additional feature of another aspect of the present invention enables providing a probe card which enables surely conducting reliable testing even at a high temperature.

BRIEF SUMMARY OF THE INVENTION

According to a first aspect of the present invention, a contactor is provided for testing electric characteristics of an object to be tested. This contactor includes: a contactor board; a plurality of conductive members formed through the contactor board; a plurality of beam members each having a tip and a base end at its both ends in which at least a conductive layer is provided between both ends and each beam member has a step between its tip and base end, which is connected to each conductive member; and a contact terminal member provided at the tip of each beam member in which the contact terminal member is formed integrally with the conductive layer of the beam member.

Preferably, the contact terminal member of this contactor is formed mainly of essentially the same material as the conductive layer of the beam member.

Preferably, the conductive layer of this contactor comprises one selected from the group consisting of nickel, copper, titanium, palladium, platinum, gold, tungsten, alloys of these metals, and metal compounds of these metals.

Preferably, the contact terminal member of this contactor is made of a high-hardness conductive metal, an alloy or metal compound thereof.

Preferably, the high-hardness conductive metal of this contactor is selected from titanium, tungsten, and alloys and metal compounds thereof.

According to a second aspect of the present invention, a method for manufacturing the contactor is provided. This manufacturing method, for forming the beam member and the contact terminal member of this contactor, comprises the steps of: forming a recess in a silicon substrate, the recess having such a cross section that deepens according to a pattern corresponding to a step shape of the beam member and being deepest at its bottom; forming a silicon layer on the recess; forming such a hole in the bottom that has a shape corresponding to the contact terminal member; and forming a film on the silicon layer and the side wall of the hole to constitute the conductive layer of the beam member and the contact terminal.

Preferably, the step of forming the silicon layer according to this method actually dopes boron.

Preferably, this manufacturing method further includes a step of directly joining the base end of the beam member to the conductive member of the contactor board.

Preferably, the joining by this manufacturing method comes in anode joining.

According to a third aspect of the present invention, a probe card is provided for testing the electric characteristics of an object to be tested. This probe card includes: a contactor according to the first aspect; a card board having a plurality of second conductive members arranged corresponding to the plurality of conductive members of the contactor; and an electric connection member interposed between the contactor and the card board. Of these components, the electric connection member serves to interconnect each of the conductive member of the contactor and each of the second conductive members of the card board.

Preferably, the electric connection member of this probe card has a cushioning structure.

Preferably, the electric connection member of this probe card is formed by a film forming process.

Preferably, the electric connection member of this probe card has an essentially Ω-shaped structure.

Preferably, the contactor board of this probe card is of an insulating nature.

Preferably, an elastic film is interposed between the contactor board and the card board of this probe card.

According to a fourth aspect of the present invention, a contactor is provided which is used to test electric characteristics of an object to be tested. This contactor includes: a contactor board; at least one conductive member formed through the contactor board; at least one beam member; and a contact terminal member provided at a tip of the beam member. Of these components, the beam member has one of a step shape and a slope shape and has its base end connected to the conductive member.

Preferably, the beam member of this contactor has a conductive layer formed thereon and its contact terminal member is formed integrally with the conductive layer of the beam member.

Preferably, the step-shaped beam member of this contactor is comprised of a plurality of step portions and a coupling portion for coupling them in such a configuration that at least one of the plurality of coupling portion couples in an inclined manner the two step portions disposed above and below it.

Preferably, the conductive member of this contactor is frusto-conical in shape in such a configuration that the base end of the beam member is connected to one of the two surfaces, whichever is larger in area.

DETAILED DESCRIPTION OF THE INVENTION

The following will describe an embodiment of the present invention with reference to FIGS. 1–10B. This embodiment is described with reference to a case where an IC chip is tested as formed on a semiconductor wafer. This case, however, is used only for explanation, and dose not limit the present invention in any way.

Figure 1:
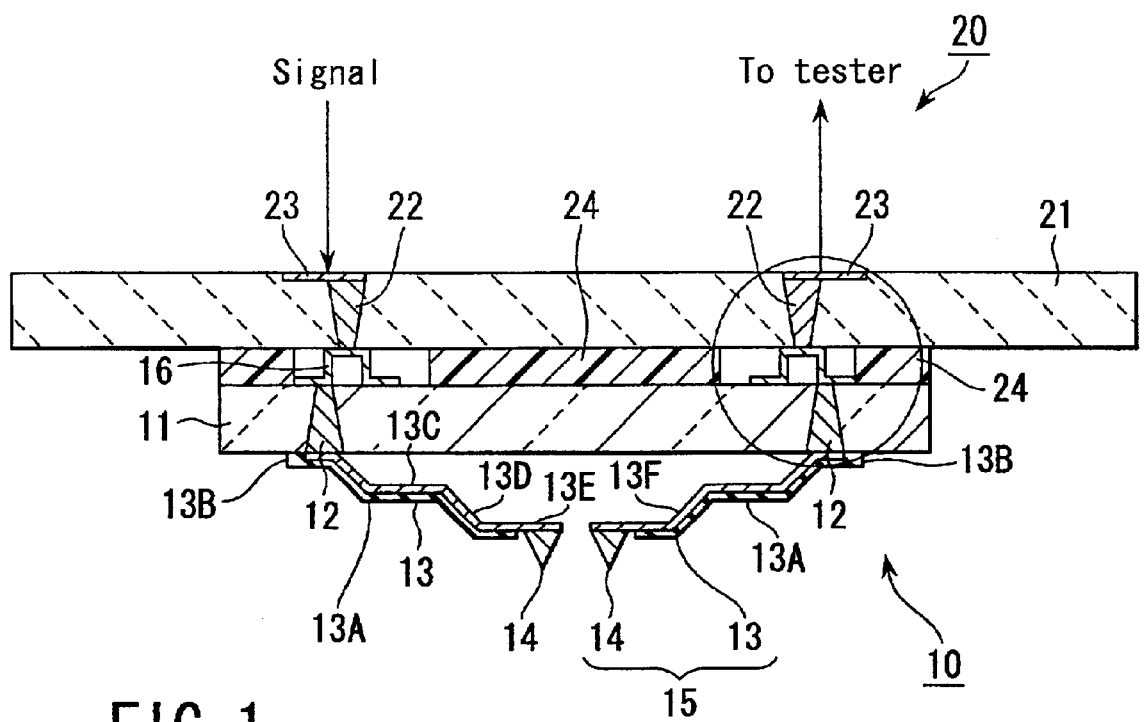
FIG. 1 is a conceptual cross-sectional view for showing one embodiment of a probe card of the present invention.

As shown in, for example, FIG. 1, a contactor of this embodiment includes a contactor board 11 made of glass etc., a plurality of conductive members 12 made of conductive metal such as aluminum, nickel, copper, etc. buried in through holes formed vertically through the contactor board 11, a plurality of beam members 13, and a contact terminal 14 (bump) provided at tips 13E of the beam members 13.

Figure 11:
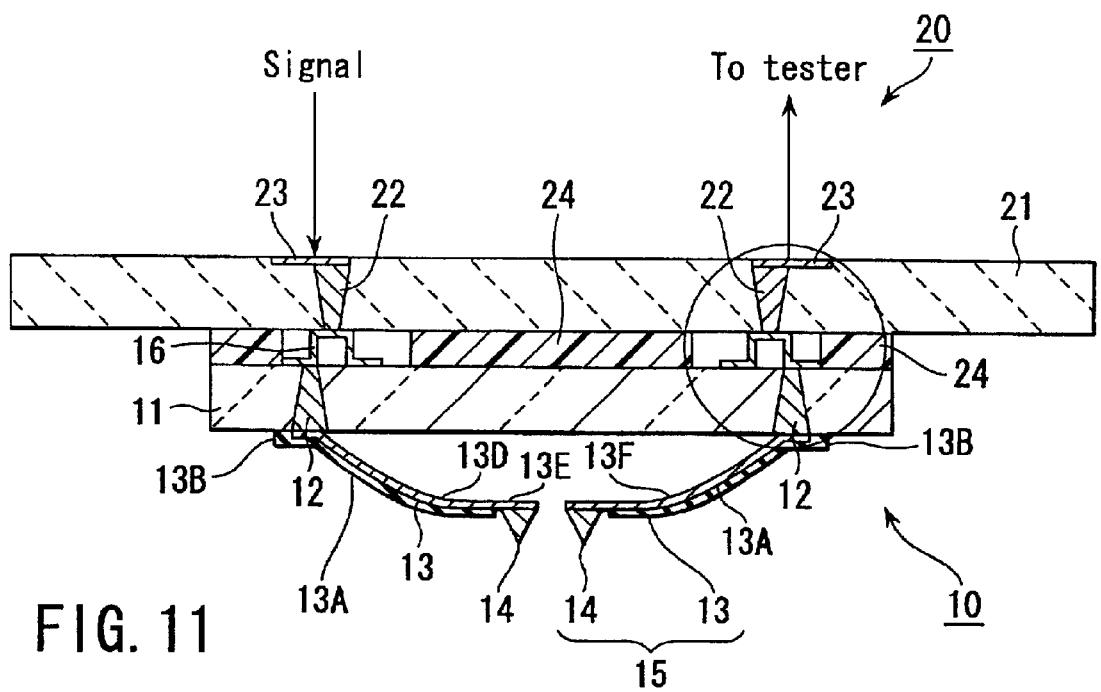
FIG. 11 is a conceptual cross-sectional view for showing another embodiment of the probe card of the present invention.
Figure 12:
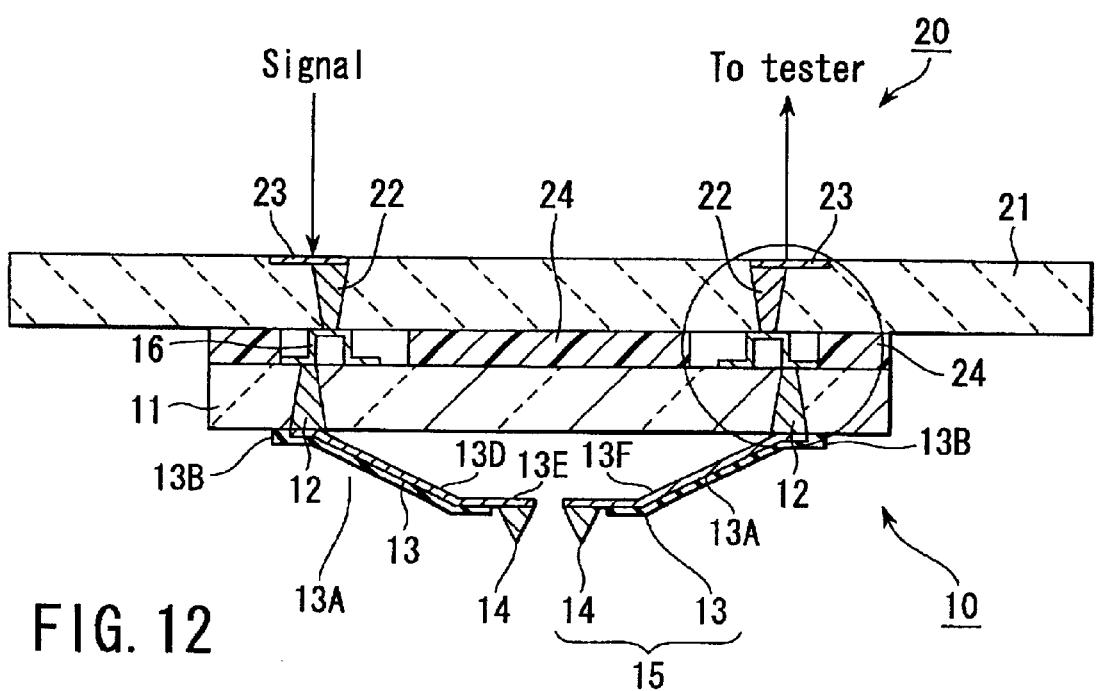
FIG. 12 is a conceptual cross-sectional view for showing a further embodiment of the probe card of the present invention.

The conductive members 12 may take on a frusto-conical-shaped structure such as a circular frustum or pyramidal frustum. The beam member 13 may have a step-shaped or arch-shaped structure between a tip 13E and a base end 13B. If the beam member 13 has a step-shaped structure, the structure includes a step portion 13C and a coupling portion 13D. This coupling portion 13D may have an inclined structure as shown in FIG. 1. The beam member 13 may have a two-layer structure comprised of a silicon layer 13A and a conductive layer 13F. An example of an arch-shaped beam member is shown in FIGS. 11 and 12. The conductive layer 13F may be made of a springy conductive metal. This conductive layer 13F may be made of any one metal appropriately selected from a group consisting of nickel, copper, titanium, palladium, platinum, gold, and tungsten and alloys and metal compounds thereof.

The surface of the contact terminal 14 may be made of a high-hardness conductive metal. This conductive metal may be titanium, tungsten, or a compound thereof. The structure may be of a quadrangular pyramidal shape.

The bump 14 is formed on the tip 13E of the beam member 13 of this embodiment. The beam member 13 and the bump 14 are combined to form a cantilever type probe. This cantilever type probe can accommodate irregularities in height of the electrode pads of an IC chip. Level differences of the beam members 13 can be adjusted properly according to differences in needle pressure or height of the bumps 14.

Thus, as shown in FIG. 1, a probe card 20 includes a card board 21, a conductive member 22 formed in the card board 21, a wiring line 23 connected at the upper end of the conductive member 22, and the contactor 10 connected to the back side of the card board 21. This wiring line 23 may be made of a conductive metal such as gold, copper, nickel, etc.

Figure 2:
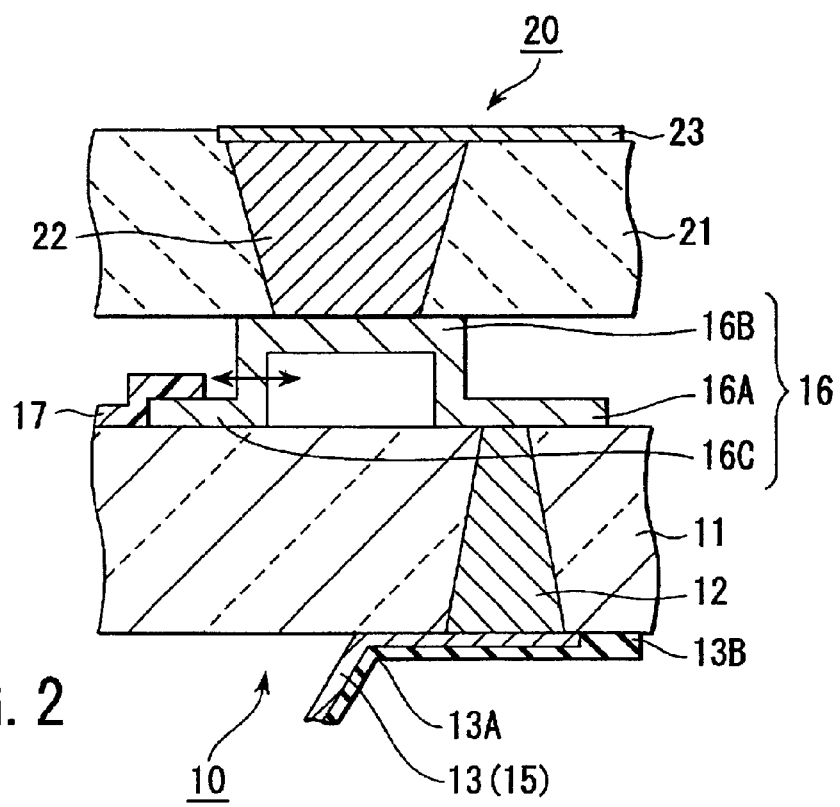
FIG. 2 is an expanded cross-sectional view for showing a connection between a contactor and a card board of the probe card of FIG. 1.

The conductive member 12 of the contactor 10 is connected to the conductive member 22 of the card board 21 through the electric connection member 16 which has a roughly Ω-shaped cross section. This electric connection member 16 may be made of a springy metal such as nickel, nickel alloy, etc. Between the contact board 11 and the card board 21 may be disposed an elastic film 24. This elastic film 24 may be made of a heat-resistant resin such as a silicon resin etc. This elastic film 24 may be formed in essentially the same thickness as the height of the electric connection member 16 connected to the contact board 21. FIG. 2 shows an enlarged view of a connection (portion encircled in FIG. 1) between the contact board 11 and the card board 21.

As shown in FIG. 2, if the electric connection member 16 is formed as Ω-shaped, it has its one leg 16A connected to the conductive member 12 of the contactor 10 and its protrusion 16B connected to the conductive member 22 of the card board 21. Although the other leg 16C is held by a regulation member 17, it is a free end fundamentally, thus providing a cushioning structure of the electric connection member 16. Even when both the contactor board 11 and the card board 21 expand thermally to thereby apply a shearing stress on the electric connection member 16, its leg 16C can slide laterally as shown by an arrow in FIG. 2, thus absorbing this shearing stress. As a result, it is possible to avoid shifting, due to thermal expansion, of the position of the contact board 11 and the card board 21.

The regulation member 17 shown in FIG. 2 for regulating the movement of the free end of the electric connection member 16 may be made of a polyimide resin. If the contactor board 11 and the card board 21 are made of such materials that have nearly the same thermal expansion coefficients, the electric connection member 16 need not always be of the above-mentioned cushioning structure.

Figure 3:
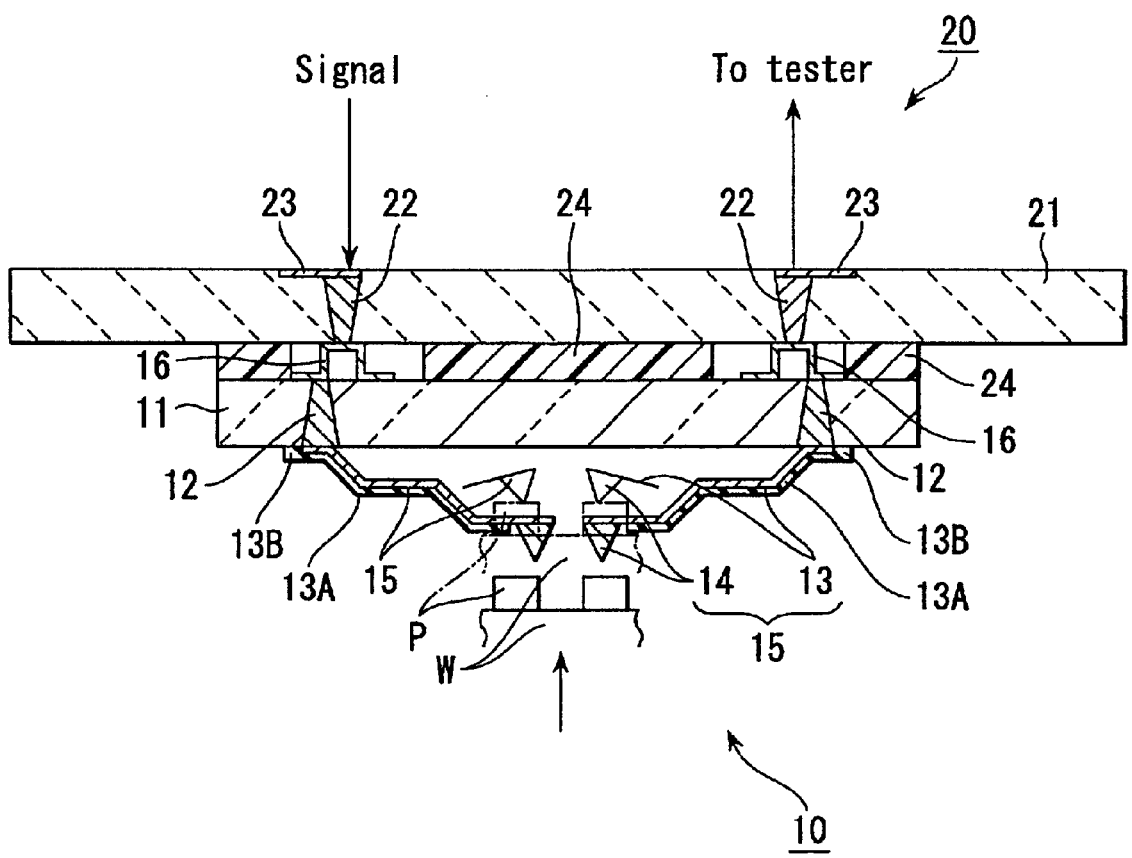
FIG. 3 is an illustration for explaining operations of the probe card of FIG. 1.

Next, the operations of the probe card of this embodiment are described with reference to FIG. 3. Once the probe card 20 is attached to a probing apparatus, a wafer W is moved just below the probe card 20 by a wafer chuck (not shown). An alignment mechanism (not shown) is used to align the contact terminals 14 of a probe 15 and electrode pads P of an IC chip formed on the wafer W with each other. After alignment, the wafer chuck as loaded with the wafer W rises to contact each of the electrode pads P with each of the contact terminals 14. Further, the wafer chuck is over-driven to thereby elevate the wafer W against a spring force of the beam member 13 as shown by a dash-and-dot line and a thin line in FIG. 3. The electrode pads P and the corresponding contact terminals 14 are thus interconnected with each other. In this case, even with irregularities in height of this plurality of electrode pads P, the beam member 13 formed in a step-shaped or arch-shaped elastic structure can be deformed elastically to thereby accommodate differences in height of the electrode pads P, thus surely contacting the bump 14 and the electrode pad P electrically. In this state, a tester sends a testing signal through the wiring line 23 to the probe card 20. This input signal is applied to the IC chip through the conductive member 22, the electric connection member 16, the conductive member 12, the probe 15, and the electrode pad P in this order. A measurement-result signal from the IC chip is input to the tester through the electrode pad P, the probe 15, the conductive member 12, the electric connection member 16, the conductive member 22, and the wiring line 23 in this order. Based on this measurement-result signal, the tester can surely test the electric characteristics of the IC chip. The elastic film 24 interposed between the contactor 10 and the card board 21 enables avoiding positional shifting due to thermal expansion of the contactor board 11 and the card board 21 even at a high temperature.

The following will describe one embodiment of a contactor manufacturing method according to the present invention. An explanation of the method of manufacturing the contactor 10 may be divided into two steps; one of forming the probe 15 and the other of making the contactor board 11. In both steps, the deposition step may be employed.

First, the step of forming the probe 15 is described, followed by a description of the step of making the contactor board 11. The manufacturing processes are described with reference to a figure showing an enlarged part of the contactor.

Figure 4A:
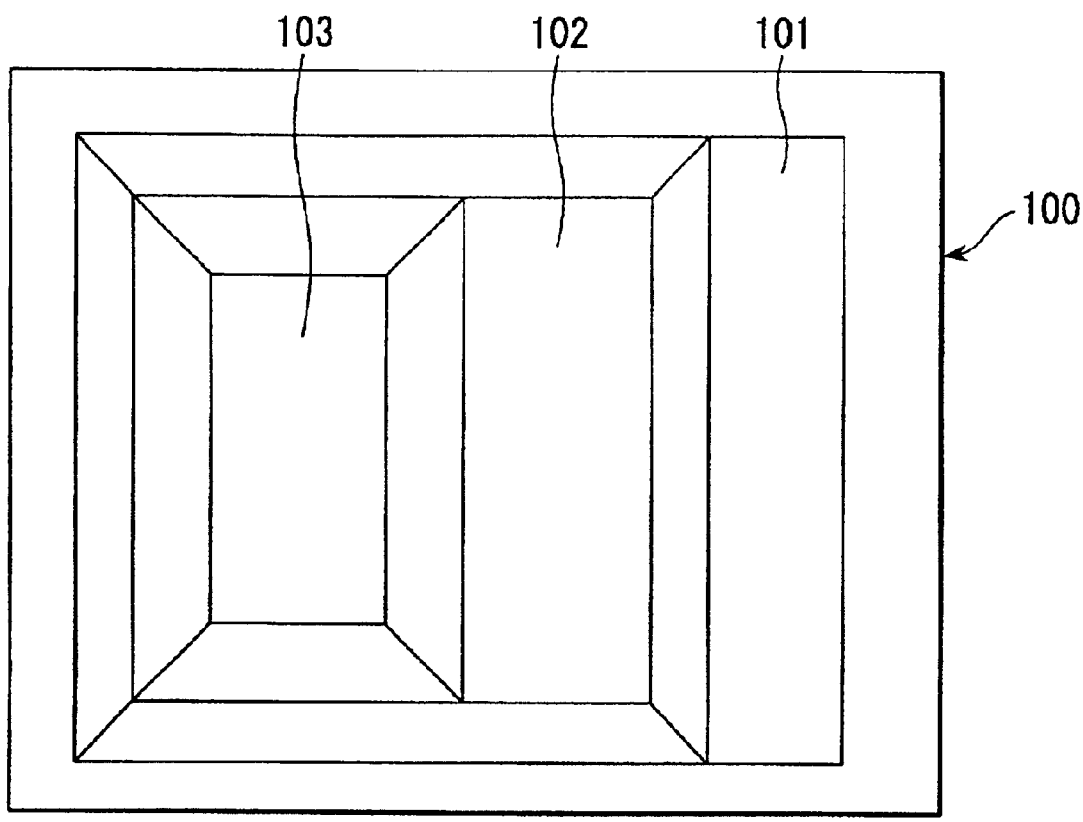
FIGS. 4A and 4B are illustrations for indicating a state where first, second, and third recesses for making a probe are formed in a silicon substrate, of which FIG. 4A indicates a plan view and FIG. 4B, a cross-sectional view thereof.
Figure 4B:
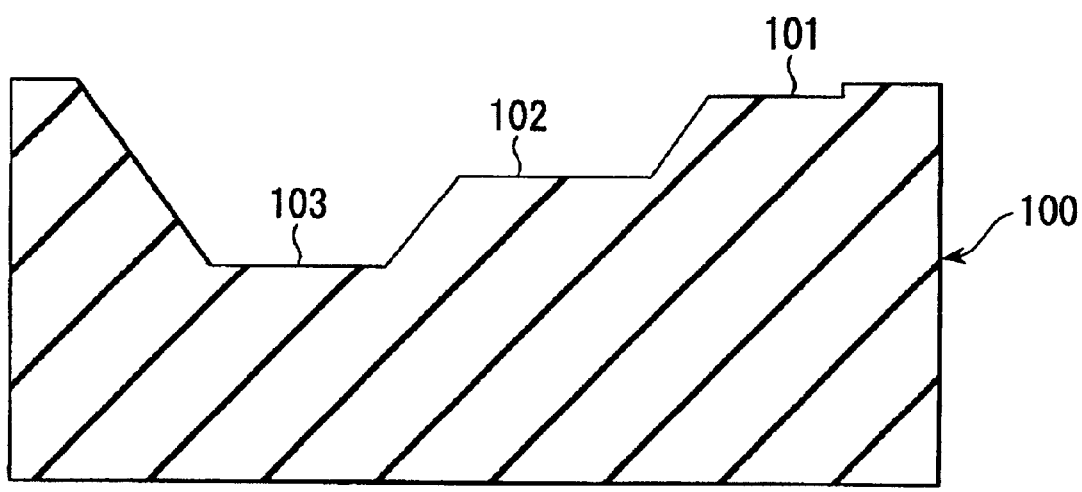

The following will describe one example of manufacturing the probe 15 with reference to FIGS. 4A–7B. First, a silicon substrate 100 is prepared. In this silicon substrate, the probe 15 is formed using a deposition process. On the silicon substrate 100 is then applied a photo-resist to form a photo-resist film. This photo-resist film is exposed and developed to form an opening (rectangular, for example) in the photo-resist film. An etchant (for example, buffered hydrofluoric acid obtained by mixing hydrofluoric acid and 40-percent ammonium fluoride aqueous solution at a ratio of 1:6) is used to etch the silicon substrate 100 starting from the opening in the photo-resist film. By this etching, as shown in FIGS. 4A and 4B, a first recess 101 is formed by etching to a depth of the thickness (e.g., 10 μm) of the conductive layer 13F of the beam member 13 (see FIG. 1). Then, the photo-resist film is removed.

Similarly, a second recess 102 is formed on the left side of the first recess 101. The second recess 102 may be formed to a depth of, for example, 80 μm. By the same method, a third recess (deepest portion) 103 is formed on the left side of the second recess 102. The third recess (deepest portion) 103 may be formed to a depth of, for example, 150 μm. By the above-mentioned steps, the first, second, and third recesses 101, 102, and 103 are formed in a step shape. The horizontal distance of a tapered surface between the first, second, and third recesses 101, 102, and 103 may each be 35 μm.

Figure 5A:
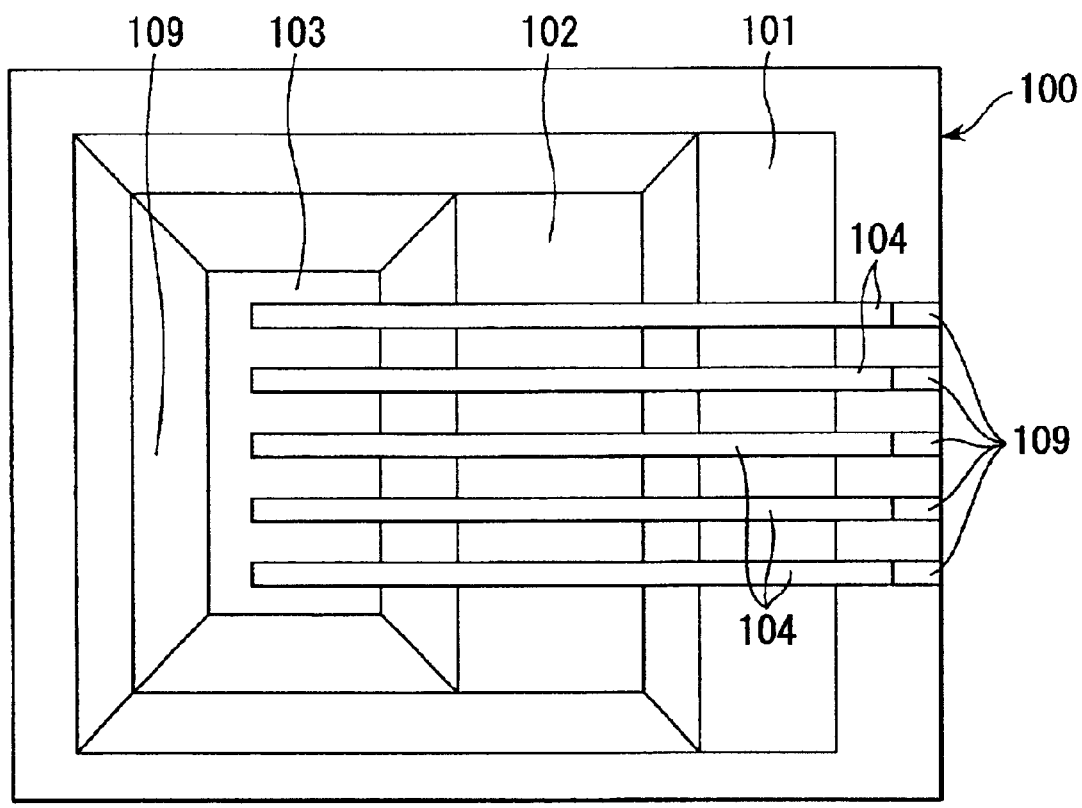
FIGS. 5A and 5B are illustrations for showing a state where a delaminated layer of the probe is formed in the first, second, and third recesses of the silicon substrate, of which FIG. 5A indicates a plan view and FIG. 5B, a cross-sectional view thereof.
Figure 5B:
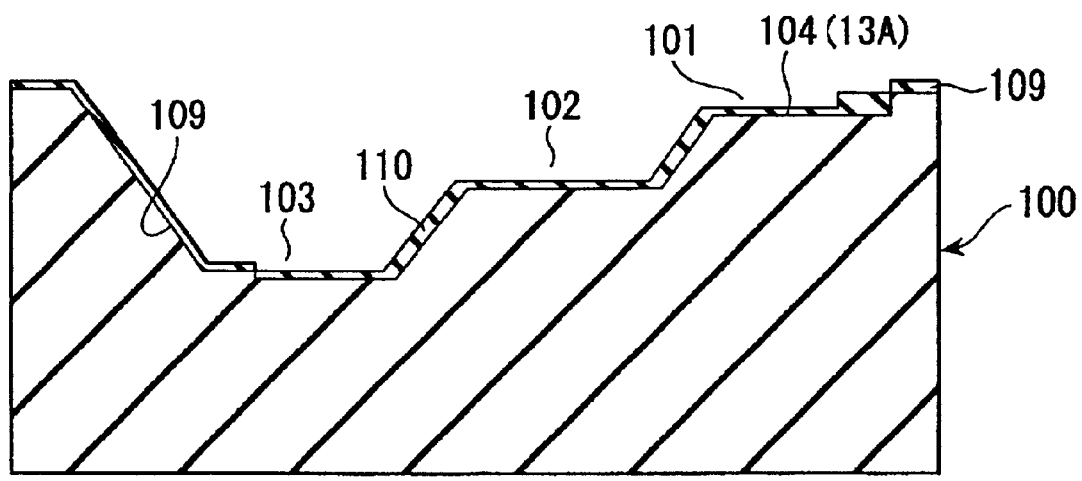

After the first, second, and third recesses 101, 102, and 103 are thus formed, the silicon substrate 100 undergoes thermal oxidation on its surface to form a thermal-oxide film thereon. Then, on the surface of this thermal-oxide film is formed a photo-resist film. This photo-resist film is exposed and developed to form such an opening in the photo-resist film that accords to an array pattern of the beam members 13 of the contactor 10. An etchant (e.g., buffered hydrofluoric acid) is used to remove the thermal-oxide film from the opening according to the pattern of the beam members 13 as shown in FIGS. 5A and 5B. The thermal-oxide film 109 except on the opening is left non-removed. The beam member 13 may measure, for example, 80 μm in width.

After the photo-resist film is removed, a publicly known prior art method is used to dope boron from the back side of the silicon substrate 100. The silicon substrate 100 is etched until a boron-doped face appears. As a result, as shown in FIGS. 5A and 5B, boron is diffused to the silicon layer 13A, which provides a base end of the beam member 13 and the silicon substrate in the opening corresponding to the array pattern of the beam members 13 in the first, second, and third recesses 101, 102, and 103. The other portions on the silicon substrate 100 are covered by the thermal-oxide film 109 and so are prevented from having boron diffused therein.

Figure 6A:
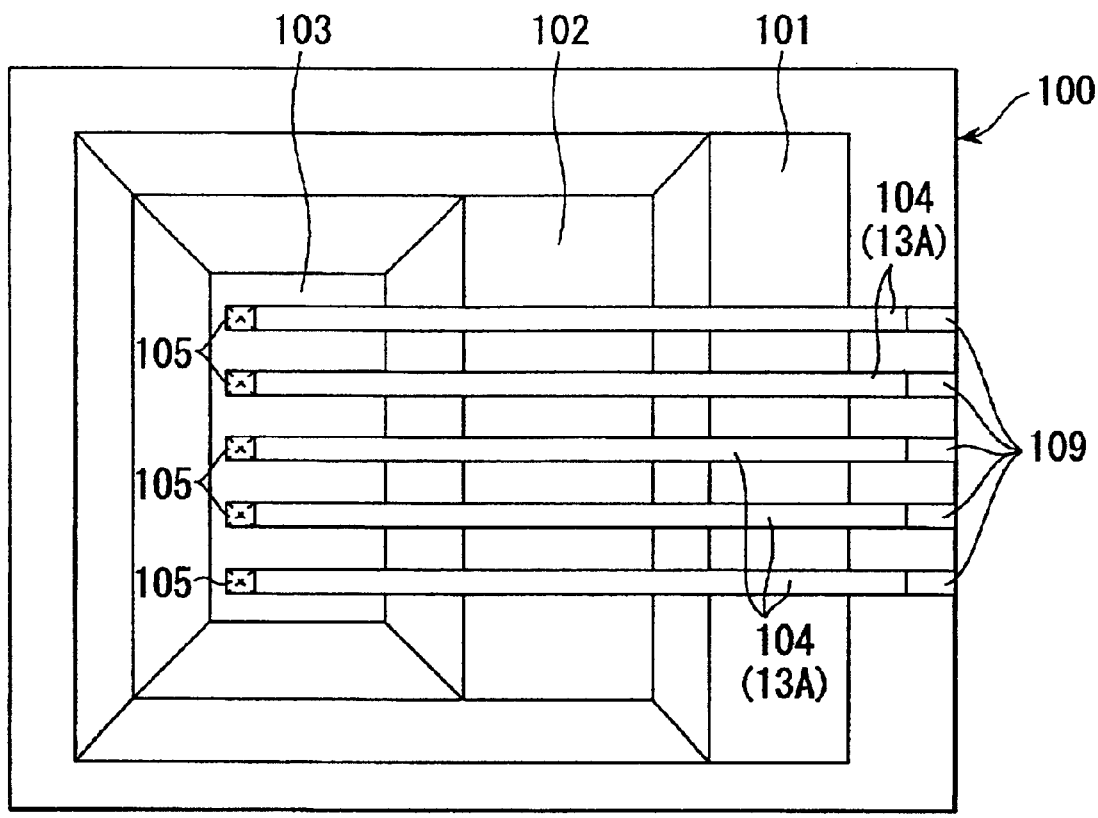
FIGS. 6A and 6B are illustrations for showing a state where a bump mold is formed in the third recess (the deepest portion) of the silicon substrate of FIG. 5, of which FIG. 6A indicates a plan view and FIG. 6B, a cross-sectional view thereof.
Figure 6B:
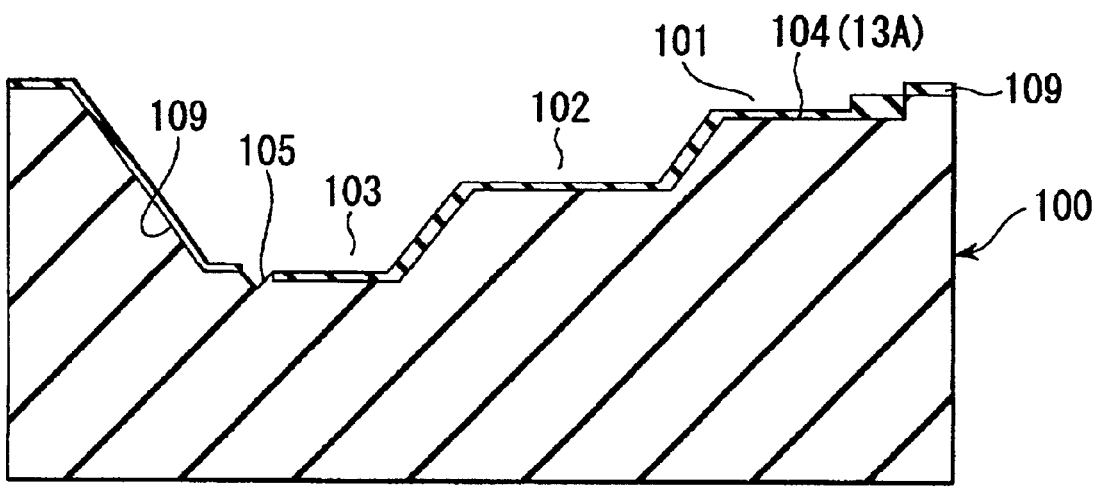

Subsequently, a publicly known prior art CVD method is used to stack a silicon oxide film (not shown) on the silicon substrate 100. On its surface is formed a photo-resist film. This photo-resist film is exposed and developed to form such an opening in the photo-resist film on the third recess 103 that accords to the array pattern of the bumps 14. An etchant (e.g., buffered hydrofluoric acid) is used to etch off the silicon oxide film in the opening to then remove the photo-resist film. A potassium hydroxide aqueous solution is used to anisotropically etch off the silicon layer from the opening. By this etching, such a reversed quadrangular frusto-pyramidal recess 105 that corresponds to the shape of the bump 14 is formed. This recess may take on any shape. Buffered hydrofluoric acid is used to remove the silicon oxide film to thereby expose, as shown in FIGS. 6A and 6B, the silicon layer 104 according to the array pattern of the beam members 13 and also form the recess 105 according to the array pattern of the bumps 14. Note here that the silicon layer 104 is hatched.

Figure 7A:
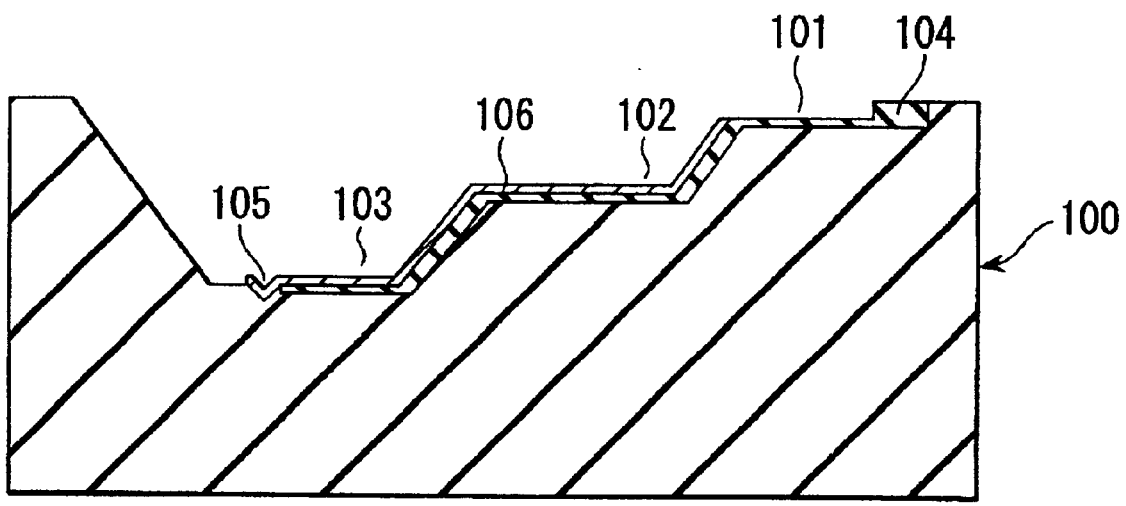
FIGS. 7A and 7B are illustrations for showing a state where the probe is formed on a silicon layer of the silicon substrate of FIGS. 6A and 6B, of which FIG. 7A indicates a cross-sectional view of a state where a titanium carbonate film is formed on the silicon layer and FIG. 7B, a cross-sectional view of a state where a nickel film is formed on the titanium carbonate film.
Figure 7B:
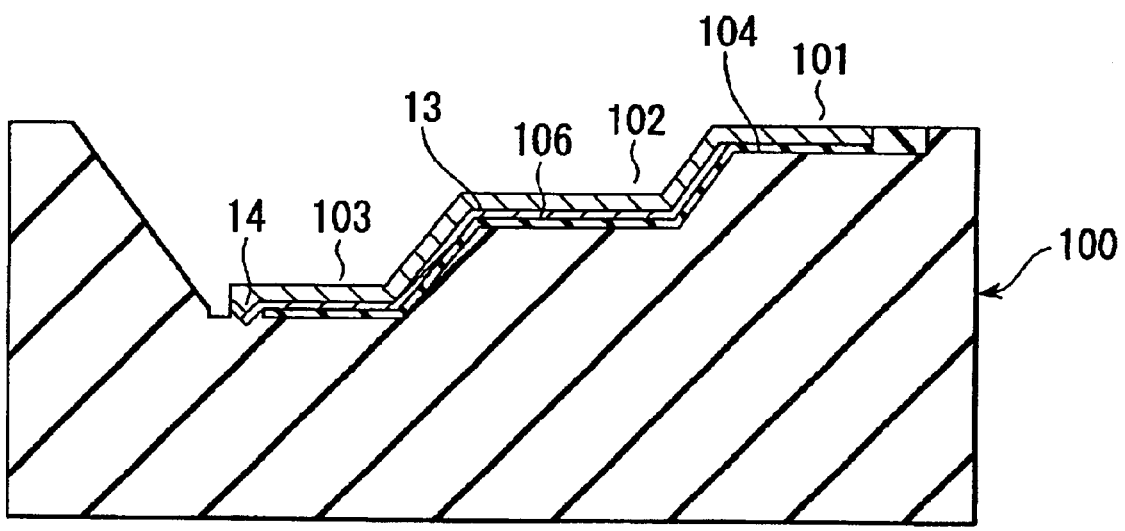

Subsequently, on the silicon substrate 100 is formed a photo-resist film 110. This photo-resist film is exposed and developed to form an opening in the recess 105 and such a portion of the photo-resist film that is hatched in FIG. 6A. Throughout on the surface of the silicon substrate 100 is formed a high-hardness conductive metal film (titanium-carbonate film) 106 by sputtering (FIGS. 7A and 7B). The titanium carbonate film 106 except its portions corresponding to the probe 15 is removed by lifting off the photo-resist film. As shown in FIG. 7A, after the remaining thermal-oxide film 109 is removed, a photo-resist film is formed on the silicon substrate 100. This photo-resist film is exposed and developed to form such an opening in the photo-resist film that corresponds to the probe 15. A tough metal (e.g., nickel) 107 is sputtered to form a nickel film throughout the surface of the silicon substrate 100 (FIG. 7A). The photo-resist film is lifted off to thereby remove the nickel film on the photo-resist film together, thus resultantly forming the beam member 13 and the contact terminal 14 of the probe 15 on the silicon substrate 100 as shown in FIG. 7B. The length of each side of the contact terminal 14 can be made in formation to have a value of, for example, 50 μm. By the above-mentioned series of processes, it is possible to simultaneously form pluralities of the beam members 13 and the bumps 14 in a predetermined array pattern on the silicon substrate 100 integrally. Accordingly, the beam member 13 and the bump 14 are integrally formed using nickel. As a result, in contrast to the prior art case, no foreign metal for connection is interposed between the beam member 13 and the contact terminal 14. This greatly improves the electric characteristics of the probe 15, especially a high-frequency characteristic. Since the contact terminal 14 is coated with the titanium carbonate film 106 having a minute crystal structure, it is not liable to be contaminated by, for example a metal oxide from the electrode pad, during testing.

Figure 8A:
FIGS. 8A–8H are conceptual cross-sectional views showing steps of forming a conductive member on the card board in series.
Figure 8B:
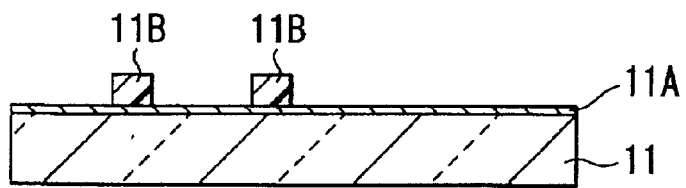
Figure 8C:
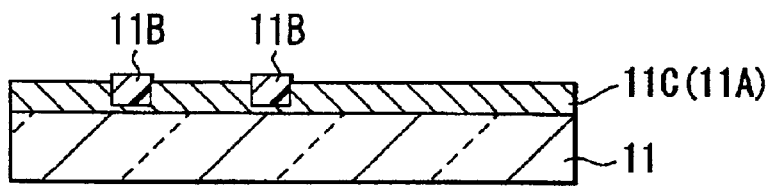

The following will describe steps of manufacturing the contactor board 11 with reference to FIGS. 8A–8H and 9A–9G. A glass board is prepared as the contactor board 11. A process is described below for forming the conductive member 12 on the contactor board 11. As shown in FIG. 8A, a nickel film (seed layer) 11A is formed by sputtering on the contactor board 11. This film serves as an underlying layer for plating. On it is formed a photo-resist film 11B. This photo-resist film 11B is exposed and developed to remove the photo-resist film 11B except the portions where the conductive member 12 is to be disposed, to expose the seed layer 11A (FIG. 8B). As shown in FIG. 8C, electrolytic plating utilizing the seed layer 11A as an electrode is conducted to form a nickel-plated layer 11C on the seed layer 11A.

Figure 8D:
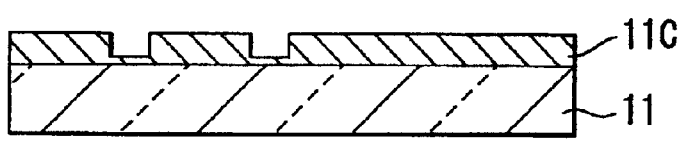
Figure 8E:
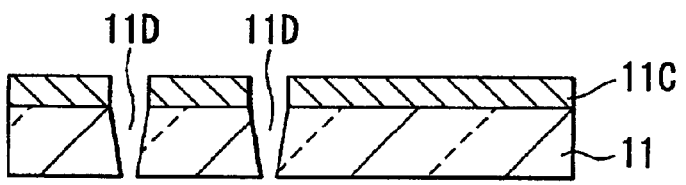
Figure 8F:
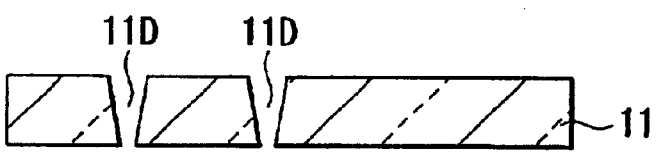
Figure 8G:
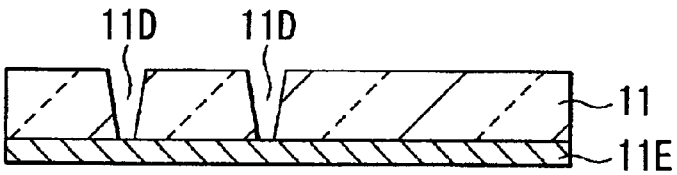
Figure 8H:
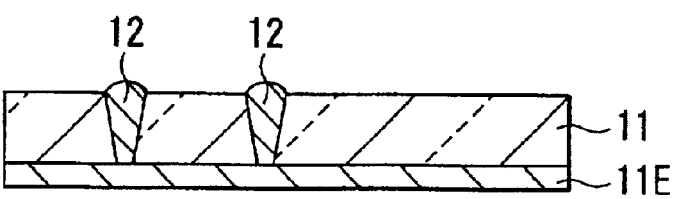

As shown in FIG. 8D, a flaking solution (e.g., sulfuric acid aqueous solution, hydrogen peroxide solution, etc.) is used to remove the photo-resist film. As shown in FIG. 8D, by reactive ion etching, the exposed seed layer 11 and the underlying Pyrex glass are removed to form a through hole 11D having a forward-tapered cross section (such as shown in FIG. 8E). After the nickel-plated layer 11C is removed by an etchant (e.g., aqua regia, etc.) as shown in FIG. 8F, a metal plate 11E is applied to the back side of the contactor board 11 as shown in FIG. 8G. This metal plate covers the smaller opening of the through hole 11D. By conducting electrolytic plating using the metal plate 11E as an electrode, nickel metal is buried into the through hole from the right side of the contactor board 11 as shown in FIG. 8H, thus forming the conductive member 12. The metal plate 11E is flaked off from the contactor board.

Figure 9A:
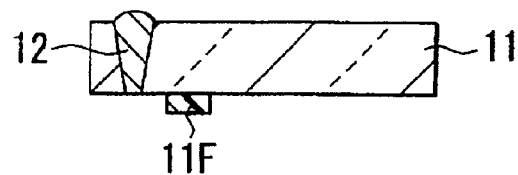
FIGS. 9A–9G are conceptual cross-sectional views for showing steps of forming an electric connection member on the card board of FIGS. 8A–8H in series.
Figure 9B:
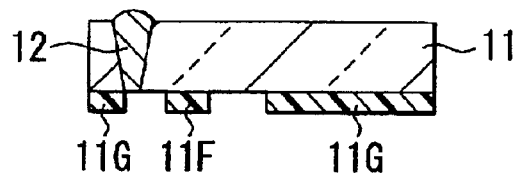

The following will describe a step of forming the Ω-shaped electric connection member 16 using deposition processing on the surface of the contactor board 11 from which the metal plate 11E was thus flaked off. As shown in FIG. 9A, a negative photo-resist film 11F is formed. The negative photo-resist film 11F is exposed and developed to be left non-removed only where the electric connection member 16 is to protrude (FIG. 9A). As shown in FIG. 9B, a positive photo-resist film 11G is formed. The positive photo-resist film 11G is exposed and developed to form an opening therein where legs 16A and 16C of the electric connection member 16 are to be formed.

Figure 9C:
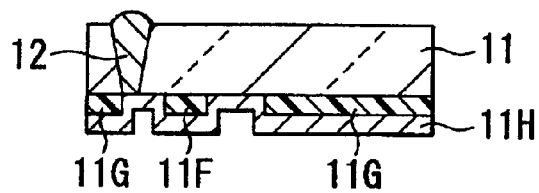

As shown in FIG. 9C, throughout the surface of the contactor board 11 where the photo-resist films 11F and 11G are formed is formed a seed layer (e.g., nickel) (not shown) by sputtering. Electrolytic plating is conducted to stack nickel-plated layer 11H on the seed layer.

Figure 9D:
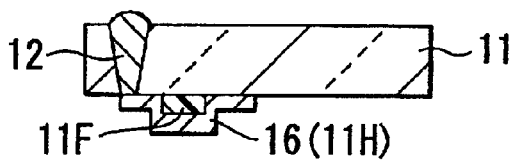

As shown in FIG. 9D, the positive photo-resist film 11G is flaked off from the contactor board 11 to flake off also the overlying nickel-plated layer 11H together. Thus, the negative photo-resist 11F and such portions of the nickel-plated layer 11H that correspond to the electric connection member 16 remain.

Figure 9E:
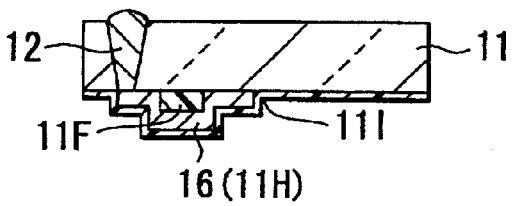
Figure 9F:
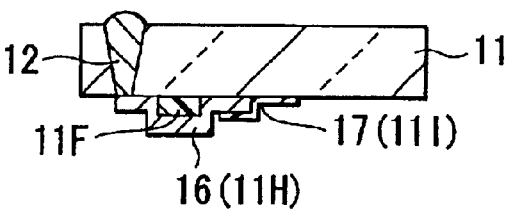

As shown in FIG. 9E, throughout the surface where, for example, the electric connection member 16 is formed is formed a polyimide 11I. On it is formed a photo-resist film (not shown). This photo-resist film is exposed and developed to be removed except such portions thereof that correspond to the regulation member 17. Thus, as shown in FIG. 9F, the regulation member 17 made of the polyimide layer 11I is formed. The regulation member 17 serves to regulate the movement of the free end (leg 16C opposite to the conductive member 12) of the electric connection member 16.

Figure 9G:
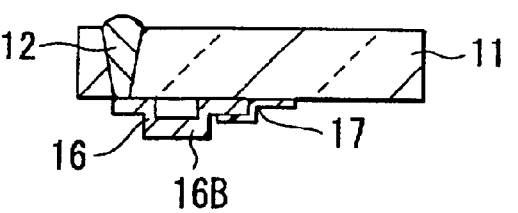

Finally, to form the protrusion 16B of the electric connection member 16, the negative photo-resist film 11F is removed. As shown in FIG. 9G, it is possible to simultaneously form the electric connection member 16 and the regulation member 17 using a consistent step on the surface of the contactor board 11.

Figure 10A:
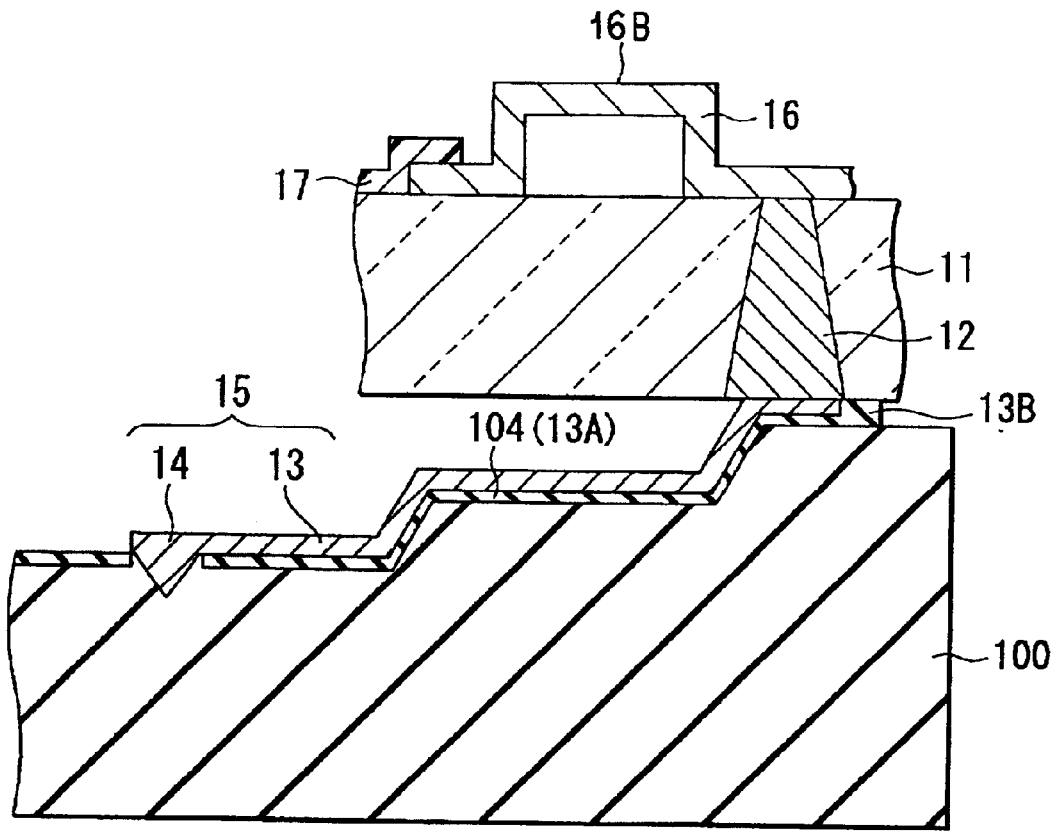
FIG. 10A is a cross-sectional view for showing a state where a probe formed on the silicon substrate and a conductive member of the card board are joined to each other and FIG. 10B, a cross-sectional view for showing a state where the silicon substrate is removed from the state of FIG. 10A.
Figure 10B:
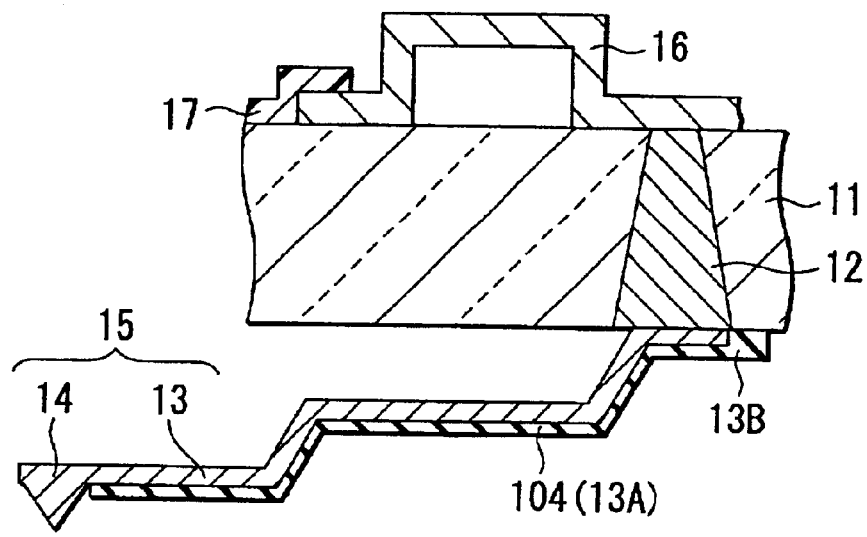

The following will describe a step of joining the probe 15 on the silicon substrate 100 and the conductive member 12 in the contactor board 11 with each other with reference to FIG. 10A. The side of the silicon substrate 100 where the probe 15 is formed is placed against the side opposite the side of the contactor board 11 where the electric connection member 16 is formed. As shown in FIG. 10A, the base end of the beam member 13 is aligned with the conductive member 12. The base end 13B of the beam member 13 is joined to the contactor board 11. Preferably, they are joined not by an ordinary joining method but by a direct joining method. An example thereof is anode joining. By this joining, the base end 13B of the silicon layer 104 (13A) is directly joined to the contactor board 11. By removing the silicon substrate 100 from the contactor board 11, the beam member 13 and the bump 14 are flaked together with the silicon layer 104 from the silicon substrate 100. Thus, the contactor 10 is formed which is integrated with the probe comprised of the contactor board 11, the beam member 13, and the bump 14. The joining of the conductive member 12 of the contactor board 11 and the probe 15 is integrated by nickel, thus avoiding a foreign metal encroaching between the beam member 13 and the bump 14 in contrast to the prior art embodiment. This greatly improves the connection reliability of the contactor 10. Direct joining (e.g., anode joining) is used to similarly join the protrusion 16B of the electric connection member 16 of the contactor 10 and the second conductive member 22 (FIG. 2) of the card board 21, thus forming the probe card 20. During manufacturing of the probe card 20, it is possible to anode-join the contactor 10 and the card board 21 after, for example, the elastic film 24 is formed on the card board 21 in a predetermined pattern to a predetermined film thickness. Since there is no foreign metal existing at the connection between the conductive member 22 of the card boards 21 and the contactor 10, the electric characteristics of the probe card, especially the high-frequency characteristic will be greatly improved. Measurement can be surely performed in the high-frequency band.

As described above, by this embodiment, the beam member 13 is formed along the contactor board 11 as separated therefrom in a step shape or arch shape. Since the bump 14 is formed integrally with the beam member 13 by the deposition process, it is possible to avoid influences such as contact resistance, electro-migration etc. between the beam member 13 and the bump 14. Measurement excellent in mechanical stability and high-frequency characteristics can be performed. By appropriately adjusting the length of the beam member 13, the probe card can accommodate a lower needle pressure. The contact terminal (e.g., bump) can be contacted to the electrode pad P without damaging the electrode pad P which can be made of gold, aluminum, copper, solder, etc. and also with a low contact resistance, in a stable manner. In a case where the beam member 13 is formed in a step shape, by appropriately adjusting the level difference between the steps, it is possible to properly adjust the amount of overdriving of a test object. In a case where the beam member 13 and the bump 14 are formed by the deposition process, it is possible to create a fine probe pattern with a high accuracy. The probe 15 can be made of such an appropriate material having a high rigidity and a high specific resistance as nickel, copper, titanium, tungsten, or an alloy thereof. Since the beam member 13 and the bump 14 need not otherwise be connected, it is possible to avoid a decrease in yield due to a faulty connection therebetween. It is also possible to avoid limitations in manufacturing such as selection of a wax material. By coating the bump 14 with metal excellent in wear resistance (e.g., titanium carbonate), the service life of the probe 15 can be prolonged. Since these metals have a minute crystal structure, it is possible to prevent an impurity such as a contaminant from sticking to the surface thereof.

By this embodiment, by providing a cushioning structure of the electric connection member 16 for electrically interconnecting the contactor 10 and the card board 21, it is possible to accommodate a difference in size between the contactor board 11 and the card board 21 even when these two are different in thermal expansion coefficient. It is also possible to surely perform measurement even at a high temperature. Preferably, of course, the contactor board 11 and the card board 21 are made of such materials that have nearly the same thermal expansion coefficients.

By this embodiment, when the beam member 13 and the bump 14 of the contactor 10 are manufactured, the first, second, and third recesses 101, 102, and 103 are formed by etching in the surface of the silicon board 100. Then, the silicon layer 104 having a pattern corresponding to the beam member 13 is formed on the surfaces of the first, second, and third recesses 101, 102, and 103. The recess 105 where the bump 14 is to be formed is formed at the tip of the deepest portion 103 of this silicon layer 104 and also, the beam member 13 and the bump are formed simultaneously by performing deposition processing on the silicon layer 104 and the recess 105. Performing the deposition processing once is enough to integrally form the beam member 13 and the bump 14 in a step shape or an arch shape.

By this embodiment, the base end 13B of the beam member 13 is directly joined (e.g., anode-joined) near the conductive member 12 of the contactor board 11. The beam member 13 and the conductive member 12 are integrated by the same metal in structure. This improves the mechanical reliability and the high-frequency characteristics of the contactor 10.

By this embodiment, it is possible to form the electric connection member 16 by the deposition process. The electric connection member 16 having a fine structure can also be manufactured in a secure manner.

The present invention is not limited at all to the above-mentioned embodiment. For example, although the above embodiment has been described with reference to a case where one contactor is made at a time, a plurality of contactors can be made also. Although it has been described with reference to a case of the probe card having one contactor, it is also possible to form a probe card having a plurality of contactors arrayed on one card board. The beam member need not have a stack structure. In short, any configuration is included in the scope of the present invention as far as it has the probe-component beam member formed as separated from the contactor board in a step or slope shape and also has the contact terminal and the beam member formed integrally.

What is claimed is:

1. A contactor which is used for testing electric characteristics of an object to be tested, said contactor comprising:
    a contactor board;
    a plurality of conductive members formed through the contactor board;
    a plurality of beam members each having a tip end and a base end at its both ends in which one end of the base end is fixed to the conductive member of the contactor board, at least a conductive layer is provided between both the ends, and each beam member has a step, which is separated from the contactor board between the tip end and the base end; and
    a contact terminal member provided at the tip end of each beam member in which the contact terminal member is formed integrally with the conductive layer of the beam member.

2. The contactor according to claim 1, wherein the contact terminal member is mainly formed of essentially the same material as the conductive layer of the beam member.

3. The contactor according to claim 2, wherein the conductive layer comprises one selected from the group consisting of nickel, copper, titanium, palladium platinum, gold, tungsten, alloys of these metals, and compounds of these metals.

4. The contactor according to claim 1, wherein the contact terminal member comprises a high-hardness conductive metal, an alloy or metal compounds thereof.

5. The contactor according to claim 4, wherein the high-hardness conductive metal is selected from titanium, tungsten, and alloys and metal compounds thereof.

6. A probe card for testing electric characteristics of an object to be tested, comprising:
    a contactor described in claim 1;
    a card board having a plurality of second conductive members arranged corresponding to the plurality of conductive members of the contactor; and
    an electric connection member interposed between the contactor and the card board, said electric connection member serving to electrically interconnect each conductive member of the contactor and each second conductive member of the card board, wherein said electric connection member has a cushioning structure.

7. The probe card according to claim 6, wherein said electric connection member is formed by a deposition process.

8. The probe card according to claim 6, wherein said electric connection member has an essentially $\Omega$-shaped structure.

9. The probe card according to claim according to claim 6, wherein said contactor board is an insulating board.

10. The probe card according to claim 6, wherein an elastic film is interposed between the contactor board and the card board.

11. A method for manufacturing the contactor described in claim 1 to form a beam member and a contact terminal member, comprising the steps of:
    forming a recess in a silicon substrate, said recess having such a cross section that deepens away from a surface of the silicon substrate according to a pattern corresponding to a step shape of the beam member and being deepest at its bottom;
    forming a silicon layer on said recess;
    forming a hole having a shape corresponding to the contact terminal member at the deepest position in said recess; and
    forming a deposition on the silicon layer and the hole to constitute the conductive layer of the beam member and the contact terminal member.

12. The method for manufacturing the contactor according to claim 11, wherein the step of forming the silicon layer comprises doping with boron.

13. The method for manufacturing the contactor according to claim 11, which further comprises a step of directly joining the base end of the beam member to the conductive member of the contactor board.

14. The method for manufacturing the contactor according to claim 13, wherein the joining is anode joining.

15. A contactor which is used to test electric characteristics of an object to be tested, comprising:
    a contactor board;
    at least one conductive member formed through the contactor board;
    at least one beam member, which has one of a step shape and a slope shape and has a tip end and a base end, one end of the base end being fixed to the at least one conductive member of the contactor board, wherein in the beam member one of the step shape and the slope shape is separated from the contactor board between the tip end and the base end; and
    a contact terminal member provided at the tip end of the at least one beam member.

16. The contactor according to claim 15, wherein said beam member has a conductive layer between the tip end and the base end, and said contact terminal member is formed integrally with the conductive layer of the beam member.

17. The contactor according to claim 15, wherein said step-shaped beam member comprises a plurality of step portions and a coupling portion for coupling these step portions,
    at least one of the plurality of coupling portions couples in an inclined manner the two step portions disposed above and below the coupling portions.

18. The contactor according to claim 15, wherein said conductive member has a frusto-conical shape, and the base end of the beam member is connected to the surface of the frusto-cone having a larger area.

* * * * *

UNITED STATES PATENT AND TRADEMARK OFFICE
CERTIFICATE OF CORRECTION

PATENT NO.   : 6,747,465 B2
DATED        : June 8, 2004
INVENTOR(S)  : Esashi et al.

It is certified that error appears in the above-identified patent and that said Letters Patent is hereby corrected as shown below:

<u>Title page, Item [54] and Column 1, line 1,</u>
Title, should read -- CONTACTOR, METHOD FOR MANUFACTORING THE SAME, AND PROBE CARD USING THE SAME --

Signed and Sealed this

Twenty-third Day of November, 2004

JON W. DUDAS
*Director of the United States Patent and Trademark Office*

UNITED STATES PATENT AND TRADEMARK OFFICE
CERTIFICATE OF CORRECTION

PATENT NO. : 6,747,465 B2
DATED : June 8, 2004
INVENTOR(S) : Esashi et al.

It is certified that error appears in the above-identified patent and that said Letters Patent is hereby corrected as shown below:

Title page, Item [54] and Column 1, line 1,
Title, should read -- CONTACTOR, METHOD FOR MANUFACTURING THE SAME, AND PROBE CARD USING THE SAME --

This certificate supersedes Certificate of Correction issued November 23, 2004.

Signed and Sealed this

Tenth Day of May, 2005

JON W. DUDAS
*Director of the United States Patent and Trademark Office*